United States Patent
Okita

(10) Patent No.: US 10,068,928 B2
(45) Date of Patent: Sep. 4, 2018

(54) DISPLAY DEVICE

(71) Applicant: Japan Display Inc., Tokyo (JP)

(72) Inventor: Mitsutaka Okita, Tokyo (JP)

(73) Assignee: Japan Display Inc., Tokyo (JP)

( * ) Notice: Subject to any disclaimer, the term of this patent is extended or adjusted under 35 U.S.C. 154(b) by 208 days.

(21) Appl. No.: 14/956,970

(22) Filed: Dec. 2, 2015

(65) Prior Publication Data

US 2016/0172377 A1 Jun. 16, 2016

(30) Foreign Application Priority Data

Dec. 15, 2014 (JP) ................... 2014-253263

(51) Int. Cl.
*H01L 27/12* (2006.01)
*G02F 1/1343* (2006.01)
*G02F 1/1362* (2006.01)

(52) U.S. Cl.
CPC ...... *H01L 27/124* (2013.01); *G02F 1/134309* (2013.01); *G02F 1/136286* (2013.01); *G02F 2001/134345* (2013.01); *G02F 2201/40* (2013.01); *G02F 2201/52* (2013.01)

(58) Field of Classification Search
CPC ......... G02F 1/134309; G02F 1/136286; G02F 2001/134345; G02F 2201/40; G02F 2201/52; H01L 27/124
See application file for complete search history.

(56) References Cited

U.S. PATENT DOCUMENTS

| 7,911,541 B2 | 3/2011 | Yamamoto et al. | |
| 2012/0050657 A1* | 3/2012 | Lin | G02F 1/136286 349/139 |
| 2013/0140570 A1* | 6/2013 | Kang | G02F 1/134363 257/59 |
| 2014/0211128 A1* | 7/2014 | Yang | G02F 1/133514 349/68 |

FOREIGN PATENT DOCUMENTS

JP 2007010753 A 1/2007

* cited by examiner

*Primary Examiner* — Bilkis Jahan
*Assistant Examiner* — Victor Barzykin
(74) *Attorney, Agent, or Firm* — Typha IP LLC

(57) ABSTRACT

A display device includes: a scan line extending in a first direction; first, second and third signal lines extending in a second direction; a first sub-pixel connected to the scan line and the first signal line; a second sub-pixel connected to the scan line and the second signal line; and a third sub-pixel connected to the scan line and the third signal line. The second signal line disposed between the first sub-pixel and the third sub-pixel is formed by a different layer so as to overlap with the third signal line as viewed in a plan view.

16 Claims, 19 Drawing Sheets

100R2

DISPLAY DEVICE

CLAIM OF PRIORITY

The present application claims priority from Japanese patent application JP2014-253263 filed on Dec. 15, 2014, the content of which is hereby incorporated by reference into this application.

BACKGROUND

The present invention relates to a display device. The invention is applicable to, for example, display devices of the RGBW method.

In a liquid crystal display device, white-display brightness is determined by brightness of its backlight and transmissivity of its liquid crystals. Since improving the backlight brightness leads to an increase in power consumption, improving the transmissivity of liquid crystals, if possible, is desirable. As an example of the method for implementing a white peak display with the white brightness enhanced by substantially improving the liquid-crystal transmissivity, there is a case, as described in Japanese Patent Laid-Open Publication No. 2007-010753, in which white pixels are used in addition to the three primary colors of red, green and blue to achieve improvement of the transmissivity characteristic without increasing the power consumption. That is, the display device is made up from pixel groups having four sub-pixels of red, green, blue and white.

SUMMARY

Through discussions on display devices of the RGBW method in which, out of red sub-pixels (hereinafter, abbreviated as 'R'), green sub-pixels (hereinafter, abbreviated as 'G'), blue sub-pixels (hereinafter, abbreviated as 'B'), one half of B are replaced with white sub-pixels (hereinafter, abbreviated as 'W'), the present inventors have found out the following problems.

That is, aperture ratios of R and G become smaller than those of W and B.

Other objects and novel features of the invention will become apparent from the description of this disclosure and the accompanying drawings.

Typical features of the invention as herein disclosed are in brief as follows:

That is, the display device includes: a scan line extending in a first direction; first, second and third signal lines extending in a second direction; a first sub-pixel connected to the scan line and the first signal line; a second sub-pixel connected to the scan line and the second signal line; and a third sub-pixel connected to the scan line and the third signal line. The second signal line disposed between the first sub-pixel and the third sub-pixel is formed by a different layer so as to overlap with the third signal line as viewed in a plan view.

DESCRIPTION OF THE PREFERRED EMBODIMENTS

Herein below, embodiments, examples and comparative examples of the invention will be described with reference to the accompanying drawings. This disclosure is no more than an example, and changes and modifications made as required with the gist of the invention maintained, which could easily be conceived for those skilled in the art, should of course be included in the scope of the invention. Still more, although drawings may be depicted more schematic than in actual aspects in terms of width, thickness, shape and the like of individual parts for a clearer explanation's sake, yet those representations are no more than an example and should not be construed as limiting the interpretation of the invention. Also, throughout this specification and the individual drawings, like constituent members previously described in conjunction with the foregoing drawings are designated by like reference signs and their detailed description may be omitted as appropriate.

<Pixel Array of RGBW Method>

Figure 1:
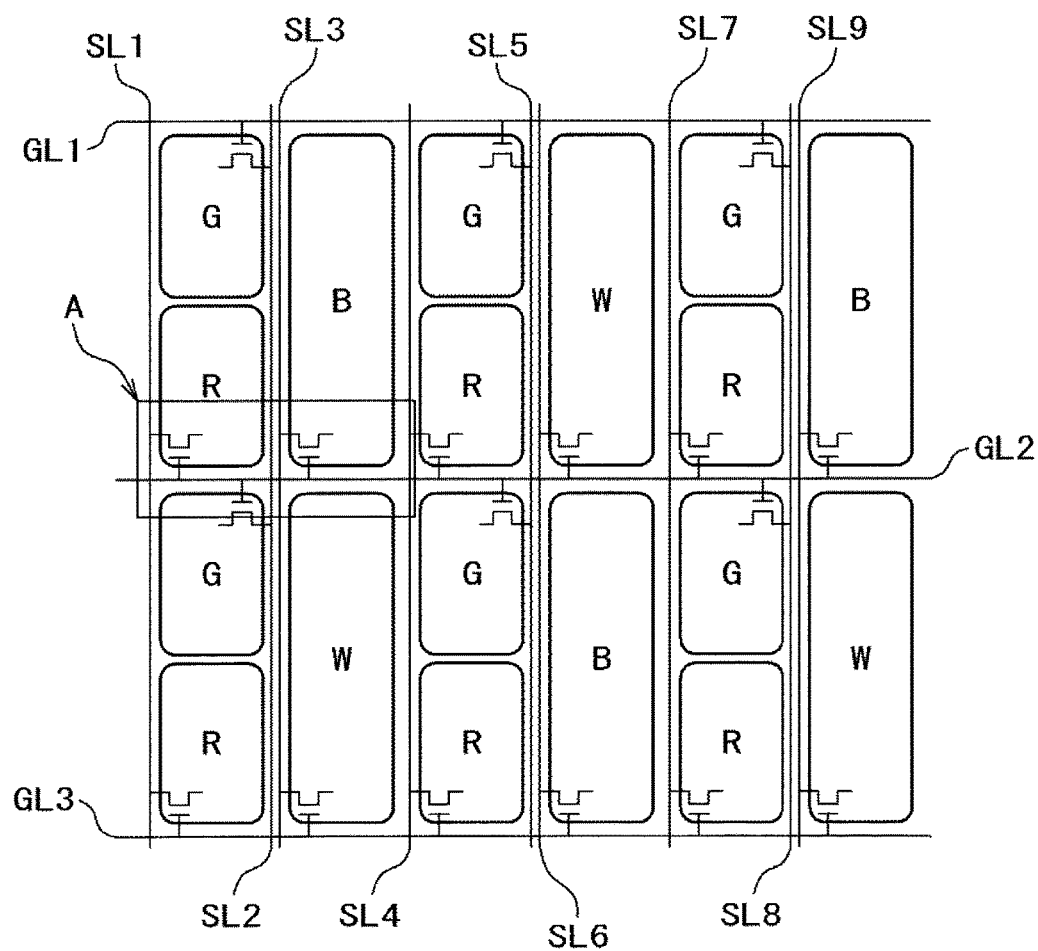
FIG. 1 is a plan view for explaining a display device according to the RGBW method.

First, pixel array in a display device of the RGBW method discussed by the present inventors (hereinafter, referred to simply as 'RGBW method') will be described with reference to FIG. 1. FIG. 1 is a plan view showing pixel array in the display device of the RGBW method.

As shown in FIG. 1, a display device 100S of the RGBW method includes a first pixel composed of R, G and B and a second pixel composed of R, G and W. In the display device 100S, half the number of B sub-pixels are replaced with W to improve the transmissivity by the addition of W. Each opening area of G and R is set to about one half of each opening area of B and W. In the first pixel, R and G are disposed adjacent to each other in a Y direction while R, G and B are disposed adjacent to each other in an X direction. In the second pixel, R and G are disposed adjacent to each other in the Y direction while R, G and W are disposed adjacent to each other in the X direction. The first pixel and the second pixel are alternately disposed in the X direction, and the first pixel and the second pixel are alternately disposed in the Y direction. Openings of the R, G, B and W are formed into rectangular shapes, respectively, which are longer-sized in the Y direction than in the X direction.

The R, G, B and W each include a TFT (Thin Film Transistor) connected to a scan line (gate line) and a signal line (source line). The scan line is connected to a gate electrode of the TFT, and the signal line is connected to a source electrode of the TFT. It is noted that the signal line may also be referred to as drain line and an electrode of the TFT connected to the drain line is referred to as drain electrode.

R and B of the first pixel disposed between a scan line GL1 and a scan line GL2 are connected to the scan line GL2, while G is connected to the scan line GL1. Also, R and W of the second pixel disposed between the scan line GL1 and the scan line GL2 are connected to the scan line GL2, while G is connected to the scan line GL1. In other words, R of the first pixel and G of the second pixel neighboring each other with the scan line GL2 interposed therebetween are connected to the scan line GL2. Also, R of the second pixel and G of the first pixel neighboring each other with the scan line GL2 interposed therebetween are connected to the scan line GL2. B of the first pixel neighboring W of the second pixel with the scan line GL2 interposed therebetween is connected to the scan line GL2, and the W of the second pixel is connected to a scan line GL3. That is, G and R neighboring each other in the Y direction are connected to the same scan line, and W and B neighboring each other in the Y direction are connected to different scan lines, respectively.

R is connected to a signal line SL1, G is connected to a signal line SL2, and W and B are connected to a signal line SL3. R and G are disposed between the signal line SL1 and the signal line SL2, and W and B are disposed between the signal line SL3 and a signal line SL4. In other words, R disposed between the signal line SL1 and the signal line SL2 is connected to the signal line SL1, and G disposed between the signal line SL1 and the signal line SL2 is connected to the signal line SL2. Also, W and B disposed between the signal line SL3 and the signal line SL4 are connected to the signal line SL3. In addition, no sub-pixels are disposed between the signal line SL2 and the signal line SL3. That is, one signal line is disposed between sub-pixels in one case while two signal lines are disposed between sub-pixels in the other case.

Comparative Example 1

Figure 2:
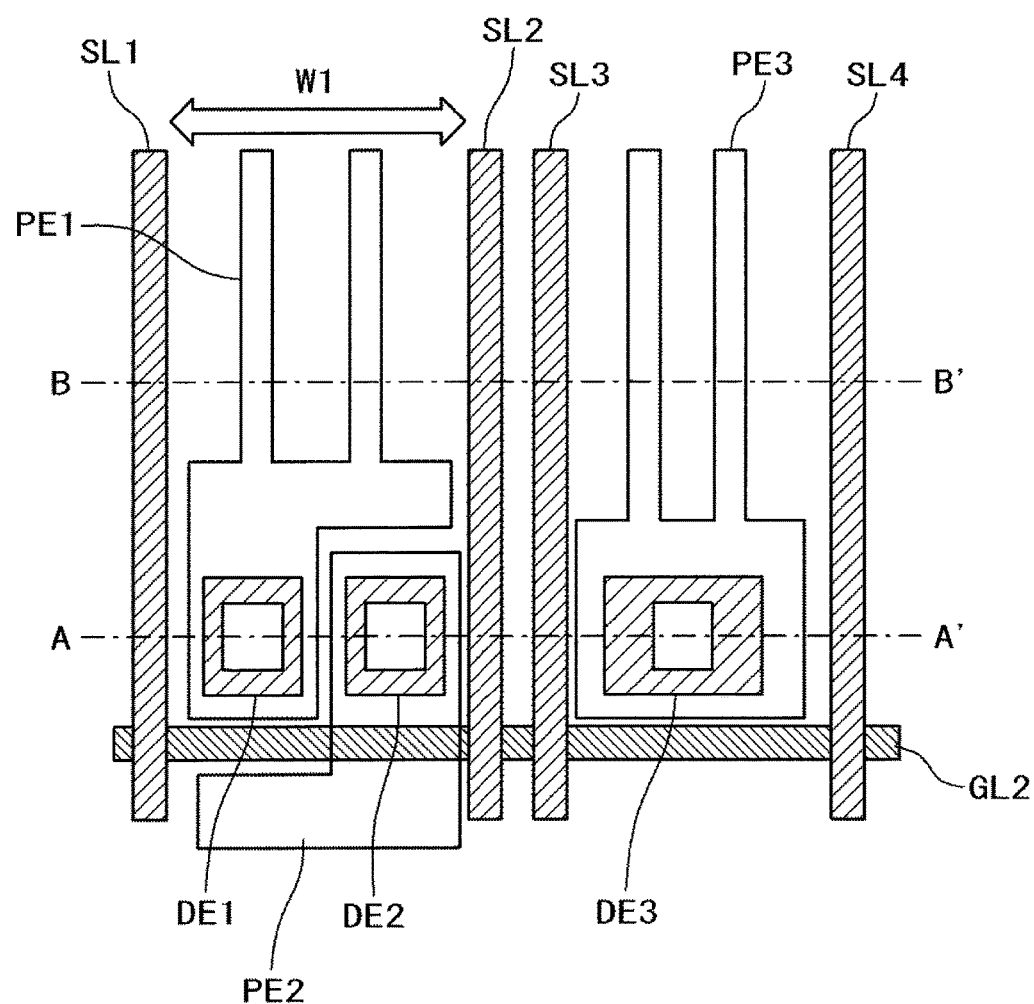
FIG. 2 is a plan view for explaining a display device according to Comparative Example 1.
Figure 3:
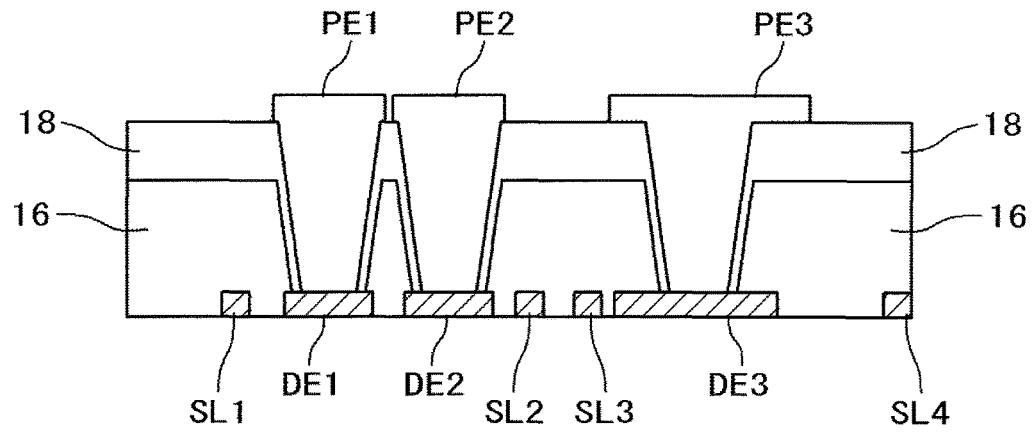
FIG. 3 is a sectional view for explaining the display device according to Comparative Example 1.
Figure 4:
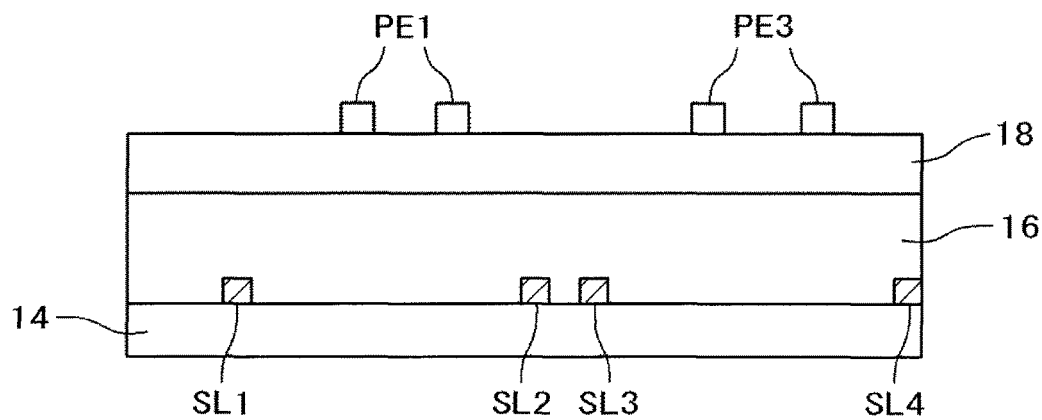
FIG. 4 is a sectional view for explaining the display device according to Comparative Example 1.

Next, a first technology (hereinafter, referred to as Comparative Example 1) discussed by the present inventors will be described with reference to FIGS. 2 to 4. FIG. 2 is a plan view of a part corresponding to part A of FIG. 1. FIG. 3 is a sectional view taken along the line A-A' of FIG. 2. FIG. 4 is a sectional view taken along the line B-B' of FIG. 2.

A display device 100R1 according to Comparative Example 1 includes a scan line GL2, an interlayer insulating film 14 formed on the scan line GL2, and signal lines SL1, SL2, SL3, SL4 as well as drain electrodes DE1, DE2, DE3 formed on the interlayer insulating film 14. Further, the display device 100R1 includes a planarizing film 16 made of an organic insulating film formed on the signal lines SL1, SL2, SL3, SL4 and the drain electrodes DE1, DE2, DE3, and an interlayer insulating film 18 formed on openings (contact holes) of the planarizing film 16 and on the planarizing film 16. Furthermore, the display device 100R1 includes pixel electrodes PE1, PE2, PE3 formed on openings (contact holes) of the interlayer insulating film 18 and on the interlayer insulating film 18. In addition, an unshown common electrode is formed between the planarizing film 16 and the interlayer insulating film 18. The pixel electrodes PE1, PE2, PE3 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, and the pixel electrode PE3 is used for B. The pixel electrodes PE1, PE2, PE3 each have two comb-tooth-like main electrodes, the two main electrodes extending in the Y direction. The main electrodes of the pixel electrode PE2, although not shown, extend in the -Y direction.

In such an arrangement of sub-pixels as shown in FIG. 1, there is a black matrix between R and G, so that equalizing X-direction lengths of the openings of R, G, B and W causes the opening area of R and G to be smaller than one half of the opening area of B and W. R and G, although twice larger in number of sub-pixels than W and B, yet each have an opening area smaller than one half that of W and B, with the result that the numerical aperture of R and G is smaller than that of W and B.

Comparative Example 2

Figure 5:
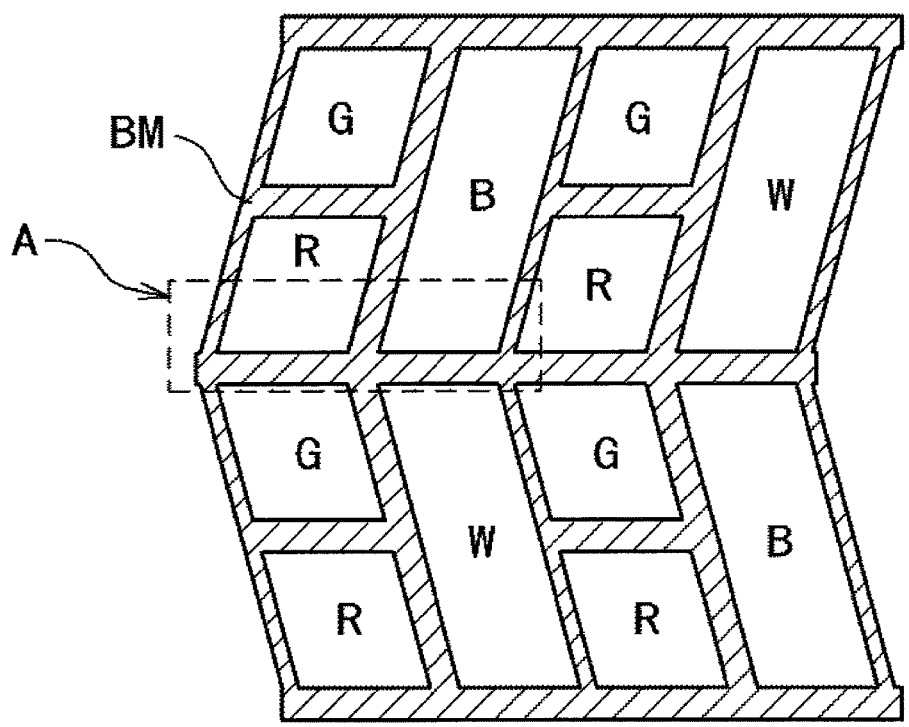
FIG. 5 is a plan view for explaining a display device according to Comparative Example 2.
Figure 5:
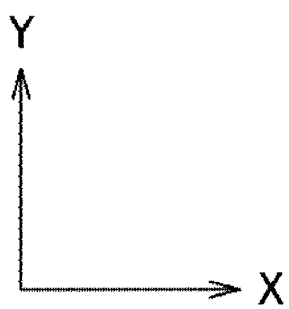
Figure 6:
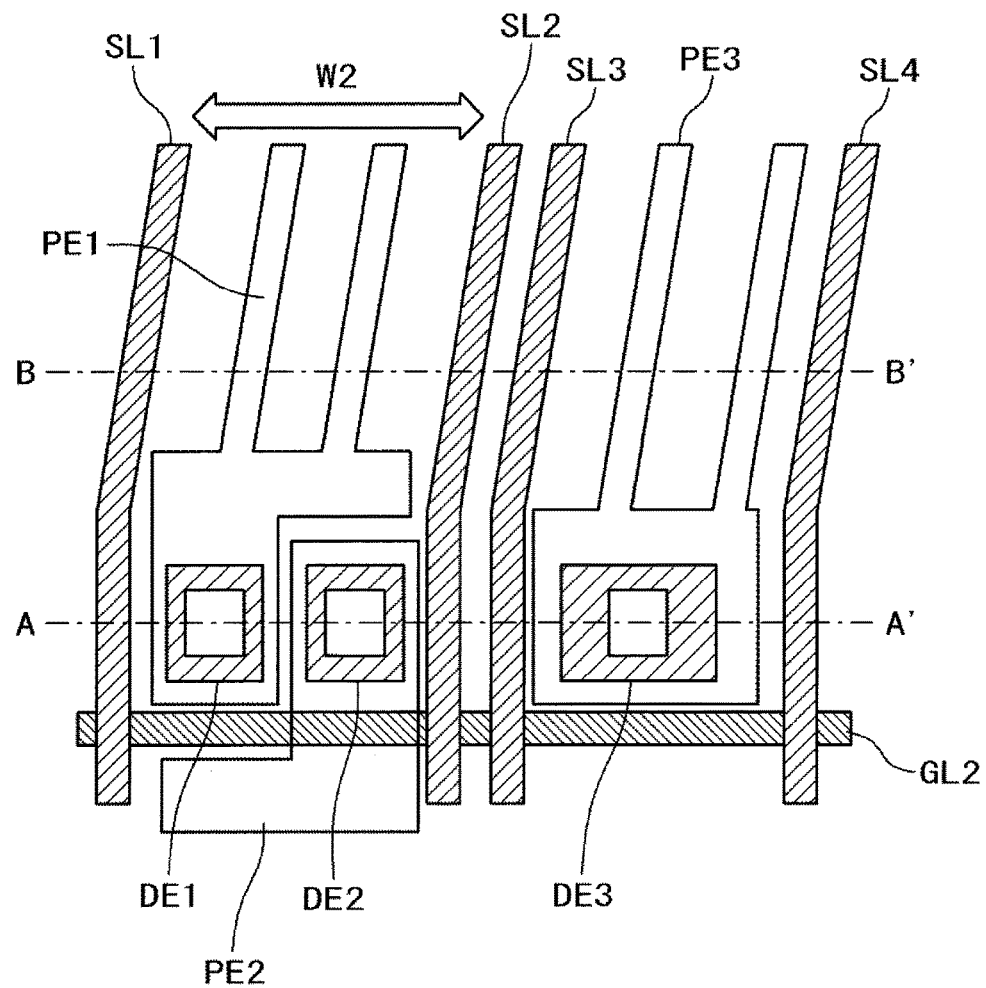
FIG. 6 is a plan view for explaining the display device according to Comparative Example 2.

Next, a second technology (hereinafter, referred to as Comparative Example 2) discussed by the present inventors will be described with reference to FIGS. 5 and 6. FIG. 5 is a plan view showing a sub-pixel opening pattern of the display device according to Comparative Example 2. FIG. 6 is a plan view of a part corresponding to broken-line part A of FIG. 5. In addition, a sectional view taken along the line A-A' of FIG. 6 is similar to FIG. 3, and a sectional view taken along the line B-B' of FIG. 6 is similar to FIG. 4.

A display device 100R2 according to Comparative Example 2 is such that signal lines of the display device 100R1 are bent pixel by pixel while its pixel and sub-pixel array is similar to that of the display device 100R1. Therefore, R, G, B and W have parallelogrammic opening shapes, respectively, which are longer-sized in the Y direction than in the X direction. In pixel electrodes of R, G, B and W, their main electrodes are inclined to a specified angle rightward or leftward relative to the Y direction. As a result of this, between two sub-pixels, two regions are formed which differ from each other in the horizontal rotational direction of liquid crystal molecules. This is called two-pixel pseudo-dual domain.

As shown in FIG. 5, the display device 100R2 has a black matrix BM between R and G, as in the display device 100R1. Therefore, equalizing the X-direction lengths of the openings of R, G, B and W causes each opening area of R and G to be smaller than one half of each opening area of B and W. R and G, although twice larger in number of sub-pixels than W and B, yet each have an opening area smaller than one half that of W and B, with the result that the numerical aperture of R and G is smaller than that of W and B.

Embodiment 1

Figure 7:
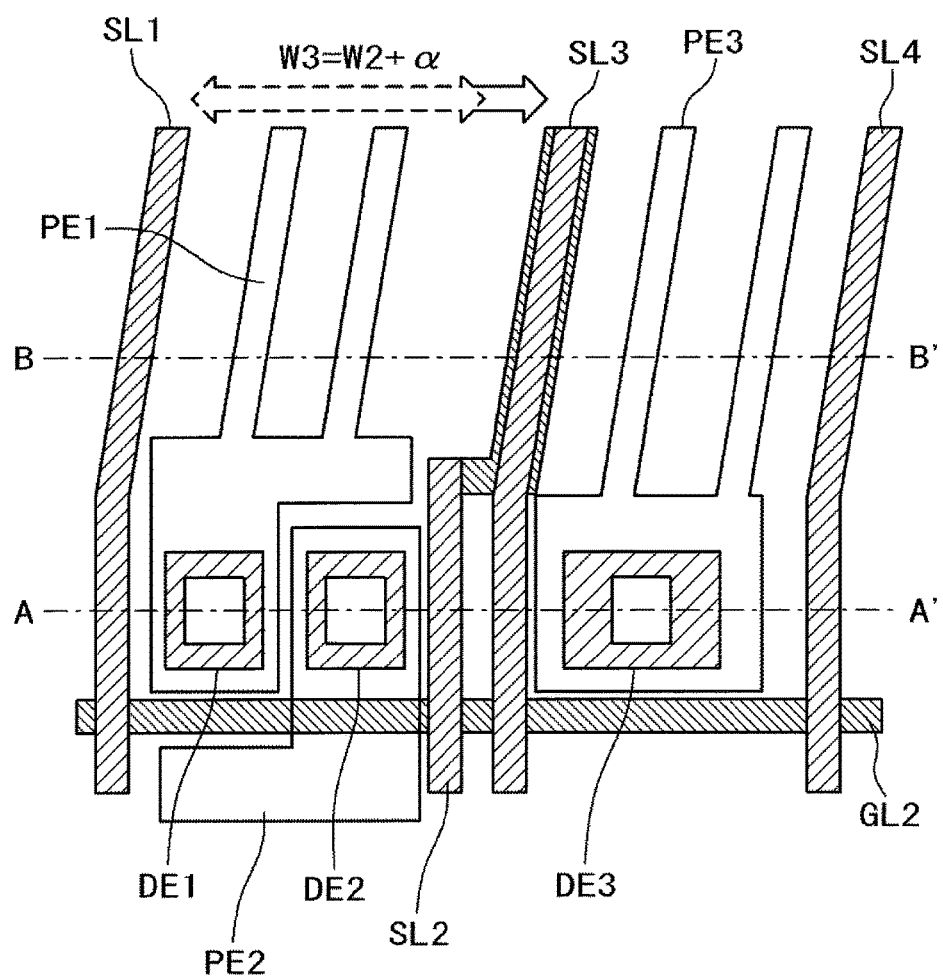
FIG. 7 is a plan view for explaining a display device according to Embodiment 1.
Figure 8:
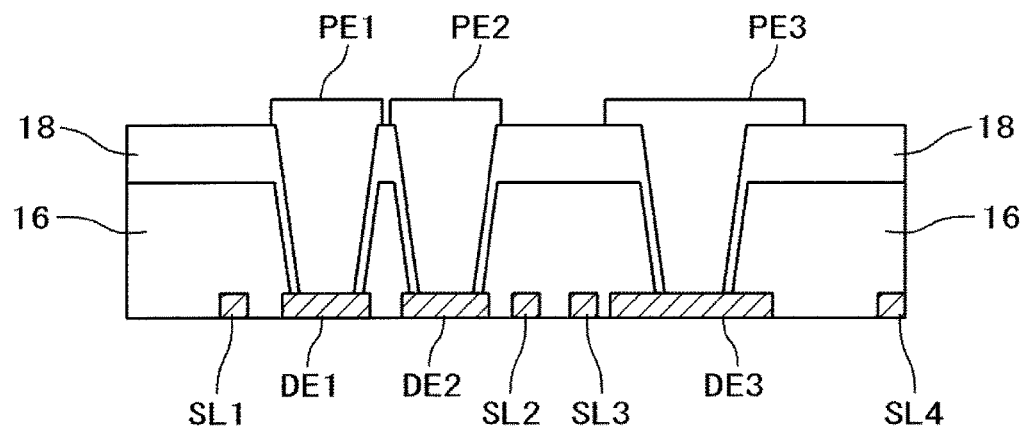
FIG. 8 is a sectional view for explaining the display device according to Embodiment 1.
Figure 9:
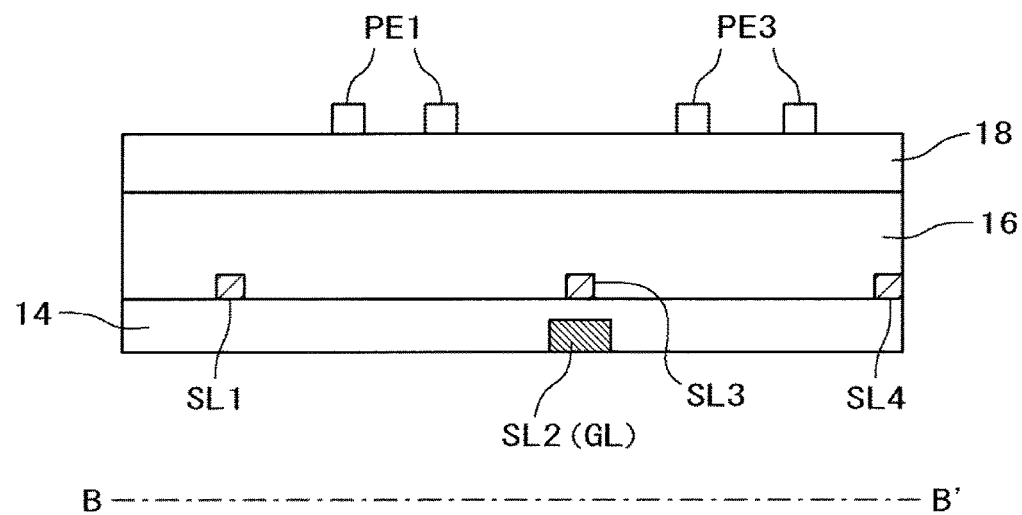
FIG. 9 is a sectional view for explaining the display device according to Embodiment 1.

A display device according to a first embodiment (Embodiment 1) will be described with reference to FIGS. 7 to 9. FIG. 7 is a plan view showing a constitution of the display device according to this embodiment. FIG. 8 is a sectional view taken along the line A-A' of FIG. 7. FIG. 9 is a sectional view taken along the line B-B' of FIG. 8.

A display device 100A according to Embodiment 1 is similar in constitution to the display device 100R2 according to Comparative Example 2 except the arrangement of the signal lines. Whereas the signal lines are formed on one identical plane (identical layer) in the display device 100R2, the display device 100A is such that part of the signal lines are formed by a different layer (identical to the scan line layer, lower than the signal line layer) so as to be stacked in layers.

Arrangement of the scan lines, the signal lines and the pixels in the display device 100A is similar to that of the display device 100S. However, the signal lines are bent pixel by pixel, and R (first sub-pixel), G (second sub-pixel), B (third sub-pixel) and W have parallelogrammic opening shapes, respectively, which are longer-sized in the Y direction than in the X direction. In pixel electrodes of R, G, B and W, their main electrodes are inclined to a specified angle rightward or leftward relative to the Y direction. As a result of this, a two-pixel pseudo-dual domain is formed.

The display device 100A includes a scan line GL2 and a signal line SL2 (GL) formed by a first interconnect layer, an interlayer insulating film 14 formed on the scan line GL2, and signal lines SL1, SL2, SL3, SL4 as well as drain electrodes DE1, DE2, DE3 made of a second interconnect layer and formed on the interlayer insulating film 14. Further, the display device 100A includes a planarizing film 16 made of an organic insulating film formed on the signal lines SL1, SL2, SL3, SL4 and the drain electrodes DE1, DE2, DE3, and an interlayer insulating film 18 formed on contact holes of the planarizing film 16 and on the planarizing film 16. Furthermore, the display device 100A includes pixel electrodes PE1, PE2, PE3 made of a second transparent electroconductive layer and formed on contact holes of the interlayer insulating film 18 and on the interlayer insulating film 18. In addition, an unshown common electrode is formed of a first transparent electroconductive layer between the planarizing film 16 and the interlayer insulating film 18. The pixel electrodes PE1, PE2, PE3 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, and the pixel electrode PE3 is used for B. The pixel electrodes PE1, PE2, PE3 each have two comb-tooth-like main electrodes, the two main electrodes extending with a rightward inclination of a specified angle relative to the Y direction. The main electrodes of the pixel electrode PE2, although not shown, extend with a leftward inclination of a specified angle relative to the −Y direction. The signal line SL2 formed by the second interconnect layer located in vicinity of an intersection with the scan line GL2 extends in the Y direction, and the signal lines SL (GL) formed by the first interconnect layer each have a portion extending in the X direction, a portion extending with a rightward inclination of a specified angle relative to the Y direction, and a portion extending with a leftward inclination of a specified angle relative to the −Y direction.

The signal line SL2 (GL) disposed between the opening of R and the opening of B is formed by the same layer as the scan lines so as to be positioned at a lower layer of the signal line SL3. Therefore, an X-direction length (W3) of the opening of R in Embodiment 1 can be made longer than an X-direction length (W2) of the opening of R in Comparative Example 2, so that the opening area can be increased. Thus, the aperture ratio X of R can be increased. The signal line SL2 (GL) disposed between the opening of G and the opening of W is also formed by the same layer as the scan lines so as to be positioned at the lower layer of the signal line SL3. Therefore, the X-direction length of the opening of G can be increased, so that the opening area can be increased. Thus, the aperture ratio of G can be increased. Since a ratio of the area of signal lines relative to the pixel area can be decreased by virtue of the stacking arrangement of the signal lines, it is implementable to achieve a higher numerical aperture even with high-definition pixels.

<Modification>

Figure 10:
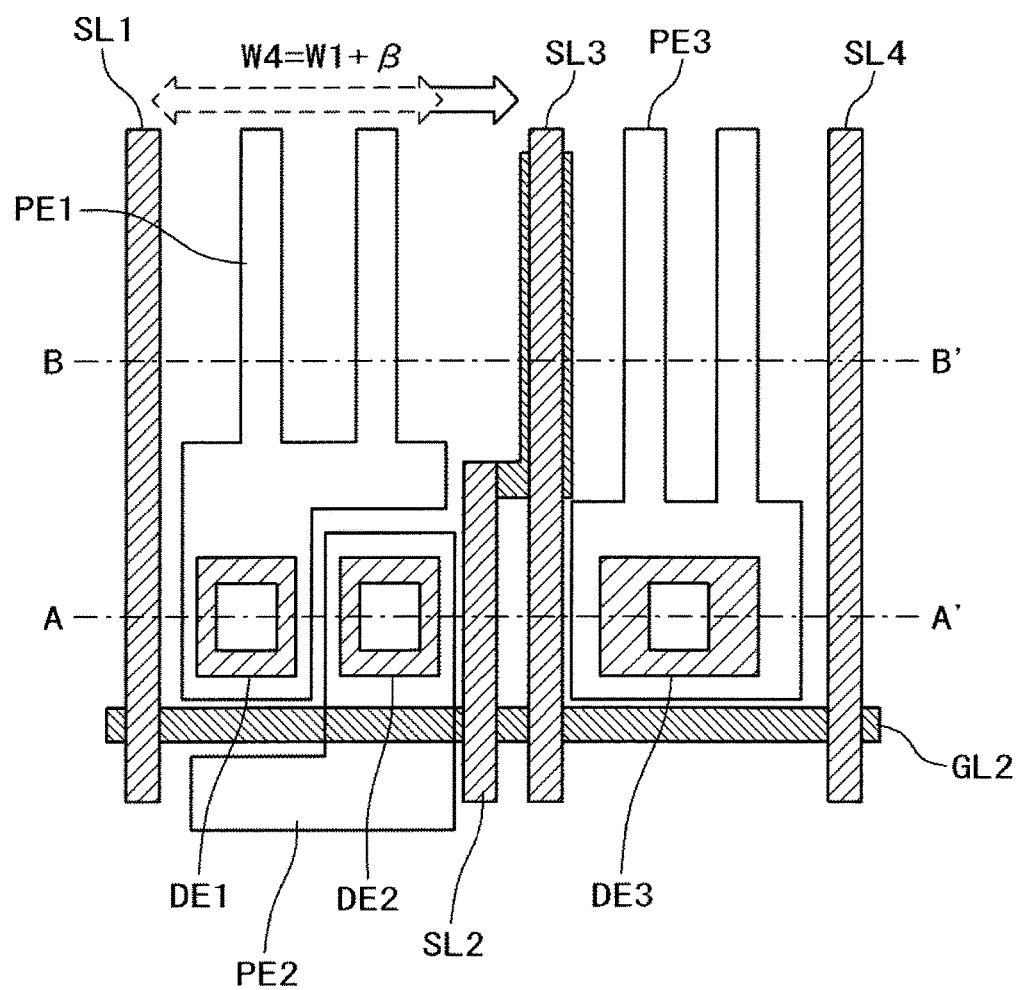
FIG. 10 is a plan view for explaining a display device according to Modification 1.

A modification of the display device according to Embodiment 1 will be described with reference to FIG. 10. FIG. 10 is a plan view showing a constitution of a display device according to this modification. In addition, a sectional view taken along the line A-A' of FIG. 10 is similar to FIG. 8, and a sectional view taken along the line B-B' of FIG. 10 is similar to FIG. 9.

The display device 100AA according to the modification is similar in constitution to the display device 100R1 according to Comparative Example 1 except the arrangement of its signal lines. Whereas the display device 100R1 has the signal lines formed on one identical plane (identical layer), the display device 100AA has part of the signal lines formed by a different layer (identical to the scan line layer) and stacked in layers, as in the display device 100A.

The display device 100AA is similar in constitution to the display device 100A except that the signal lines SL1, SL2, SL3 extend linearly in the Y direction while two main electrodes of the pixel electrodes PE1, PE2, PE3 extend in the Y direction. In the display device 100AA, the signal line SL2 formed by the second interconnect layer extends in the Y direction, and the signal lines SL (GL) formed by the first interconnect layer each have a portion extending in the X direction and a portion extending in the Y direction.

In the display device 100AA, as in the display device 100A, the signal line SL2 (SL) disposed between the opening of R and the opening of B is formed by the same layer as the scan lines so as to be positioned at a lower layer of the signal line SL3. Therefore, the X-direction length (W4) of the opening of R in this modification can be made longer than the X-direction length (W1) of the opening of R in the comparative examples, so that the opening area can be increased. Thus, the aperture ratio of R can be increased. The signal line SL2 (SL) disposed between the opening of G and the opening of W is also formed by the same layer as the scan lines so as to be positioned at the lower layer of the signal line SL3. Therefore, the X-direction length of the opening of G can be increased, so that the opening area can be increased. Thus, the aperture ratio of G can be increased. Since a ratio of the area of signal lines relative to the pixel area can be decreased by virtue of the stacking arrangement of the signal lines, it is implementable to achieve a higher numerical aperture even with high-definition pixels.

Example 1

Figure 11:
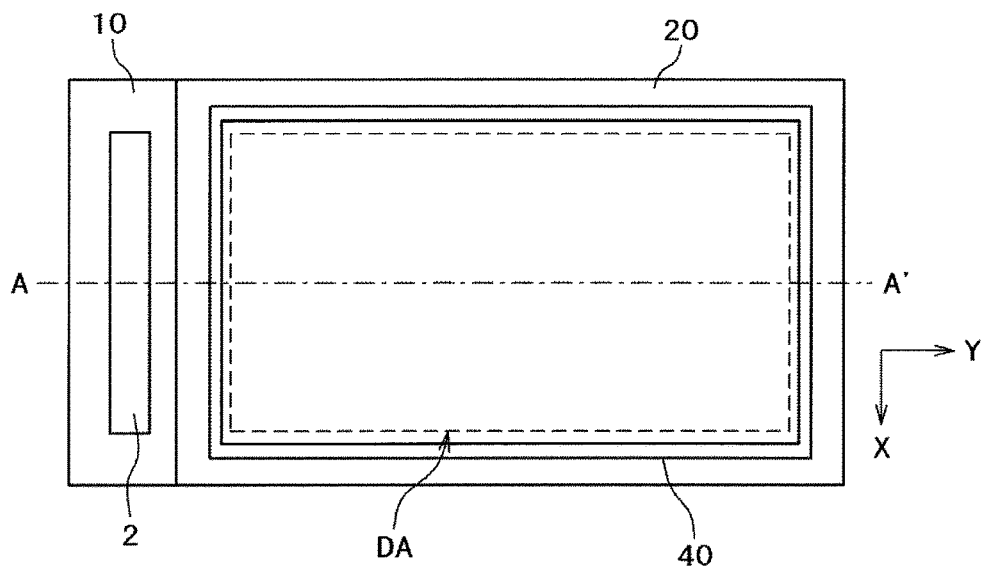
FIG. 11 is a plan view for explaining a display device according to Example 1.
Figure 12:
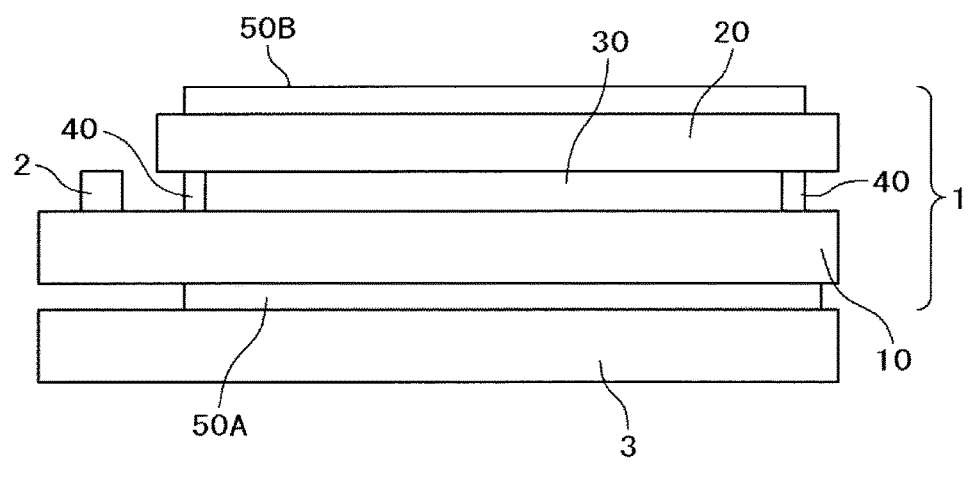
FIG. 12 is a sectional view for explaining the display device according to Example 1.
Figure 13:
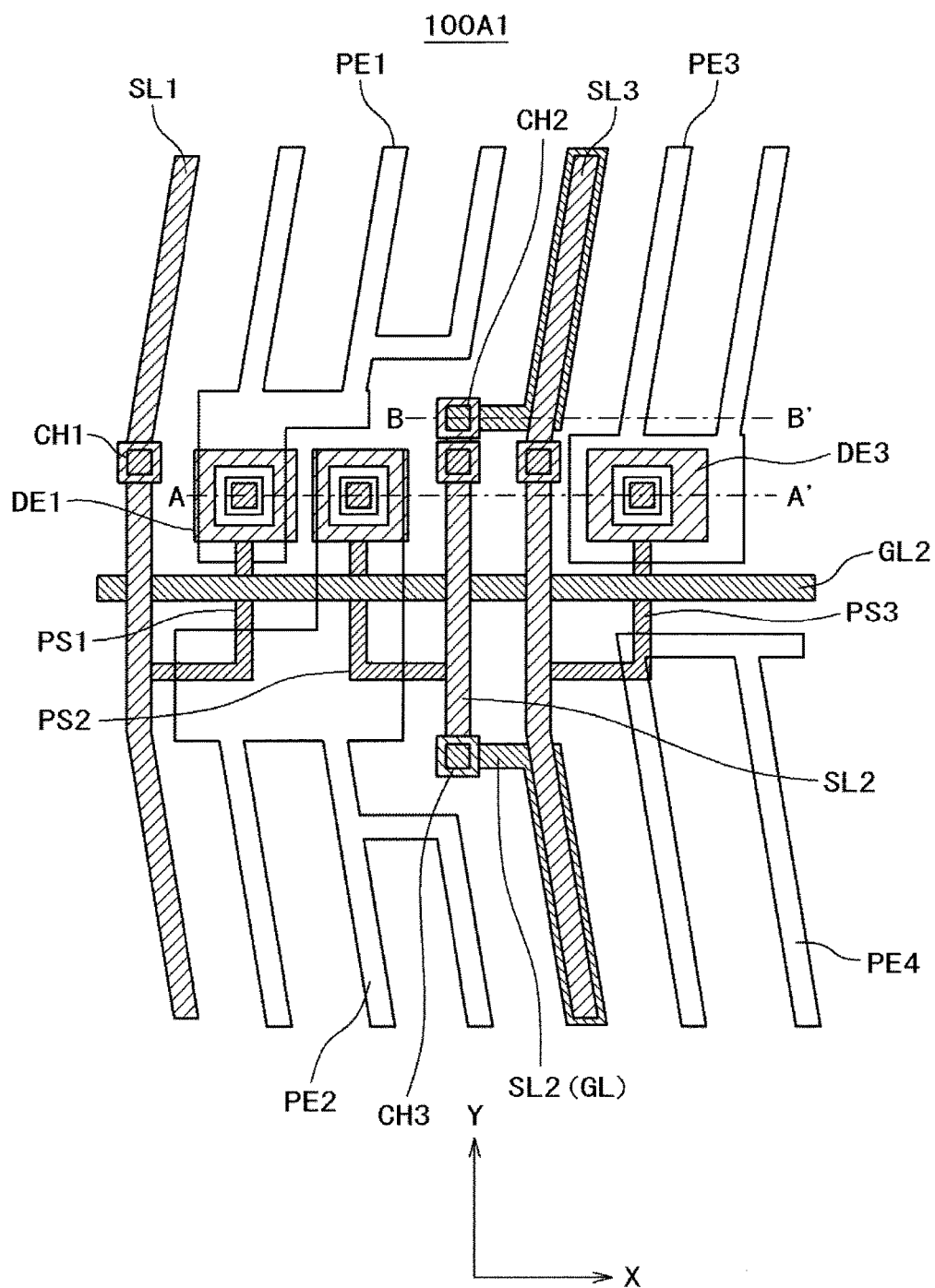
FIG. 13 is a plan view for explaining the display device according to Example 1.
Figure 14:
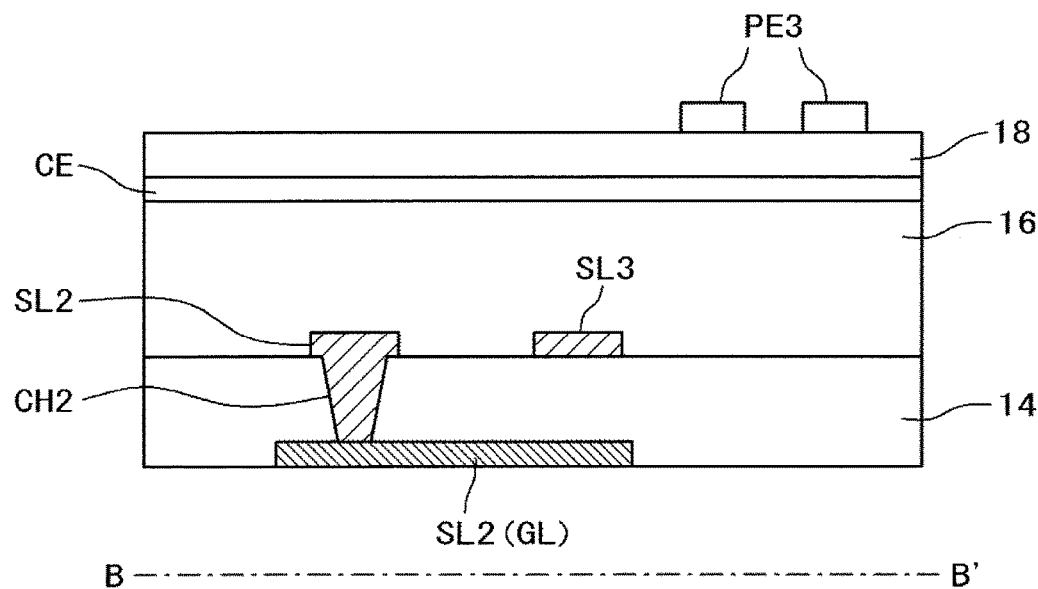
FIG. 14 is a sectional view for explaining the display device according to Example 1.
Figure 15:
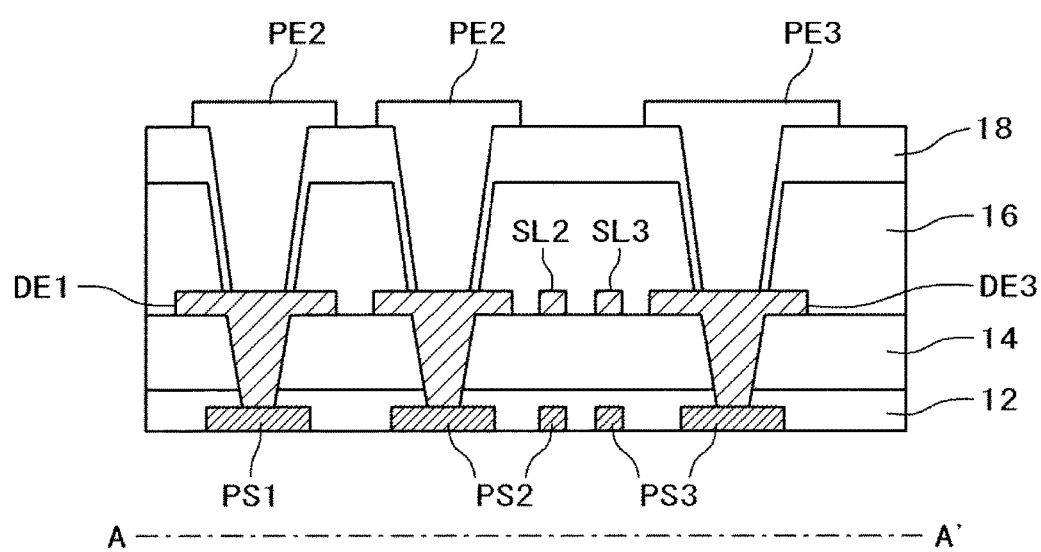
FIG. 15 is a sectional view for explaining the display device according to Example 1.

A display device according to Example 1 will be described with reference to FIGS. 11 to 15. FIG. 11 is an overall plan view of the display device according to Example 1. FIG. 12 is a sectional view taken along the line A-A' of FIG. 11. FIG. 13 is a plan view for explaining an arrangement of pixels, scan lines and signal lines in the display device according to Example 1. FIG. 14 is a sectional view taken along the line A-A' of FIG. 13. FIG. 15 is a sectional view taken along the line B-B' of FIG. 13.

As shown in FIGS. 11 and 12, the display device 100A1 according to Example 1 includes a display panel 1, a driver IC 2 and a backlight 3. The display panel 1 includes an array substrate 10, a counter substrate 20, and a liquid crystal material 30 sealed between the array substrate 10 and the counter substrate 20. The array substrate 10 and the counter substrate 20 are adhesively bonded to each other with an annular sealing material 40 surrounding a display area DA, and the liquid crystal material 30 is sealed in a space surrounded by the array substrate 10, the counter substrate 20 and the sealing material 40. Also, on outward-facing surfaces of the array substrate 10 and the counter substrate 20, i.e., on their surfaces opposite to their surfaces facing the liquid crystal material 30, a lower polarizing plate 50A and an upper polarizing plate 50B are provided, respectively. The display area DA is made up from a set of plural pixels disposed in a matrix array as an example. The array substrate 10 includes later-described signal lines extending in the Y direction, scan lines extending in the X direction, pixel electrodes, an unshown scanning circuit formed from TFTs for driving the scan lines, and the like. The counter substrate 20 includes an unshown black matrix, color filters and the like. The driver IC 2 includes an unshown circuit for driving the signal lines and the like.

As shown in FIGS. 13 to 15, the display device 100A1 includes a gate insulating film 12 formed on polysilicon layers PS1, PS2, PS3, which are semiconductor layers of TFTs, a scan line GL2 and a signal line SL2 (GL) formed by a first insulating layer made of a metal film on the gate insulating film 12, an interlayer insulating film 14 formed on the scan line GL2, and signal lines SL1, SL2, SL3 as well as drain electrodes DE1, DE2, DE3 formed by a second interconnect layer made of a metal film on the interlayer insulating film 14. Further, the display device 100A1 includes a planarizing film 16 made of an organic insulating film formed on the signal lines SL1, SL2, SL3 and the drain electrodes DE1, DE2, DE3, a common electrode CE formed by an ITO film, which is a first transparent electroconductive film, on the planarizing film 16, an interlayer insulating film 18 formed on the common electrode CE, and pixel electrodes PE1, PE2, PE3, PE4 formed by an ITO film, which is a second transparent electroconductive film, on the interlayer insulating film 18. The pixel electrodes PE1, PE2, PE3, PE4 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, the pixel electrode PE3 is used for B, and the pixel electrode PE4 is used for W. The pixel electrodes PE1, PE2, PE3, PE4 each have two comb-tooth-like main electrodes. The two main electrodes of the pixel electrodes PE1, PE3 extend with a rightward inclination of a specified angle relative to the Y direction, and the main electrodes of the pixel electrodes PE2, PE4 extend with a leftward inclination of a specified angle relative to the −Y direction.

The signal line SL2 (GL) disposed between the opening of R and the opening of B is formed by the same layer as the scan line (GL2) so as to be positioned at a lower layer of the signal line SL3. The signal line SL2 formed by the second interconnect layer and extending in the Y direction is connected to the signal line SL2 (GL) formed by the first interconnect layer via a contact hole CH2 of the interlayer insulating film 14. The signal line SL2 (GL) formed by the first interconnect layer has a portion extending in the X direction and a portion extending with a rightward inclination of a specified angle relative to the Y direction. The signal line SL2 (GL) disposed between the opening of G and the opening of W is also formed by the same layer as the scan lines so as to be positioned at the lower layer of the signal line SL3. The signal line SL2 formed by the second interconnect layer and extending in the Y direction is connected to the signal line SL2 (GL) formed by the first interconnect layer via a contact hole CH3 of the interlayer insulating film 14. The signal line SL2 (GL) formed by the first interconnect layer has a portion extending in the X direction and a portion extending with a leftward inclination of a specified angle relative to the −Y direction. The signal lines SL1, SL2, SL3 as well as the drain electrodes DE1, DE2, DE3 are connected to the polysilicon layers PS1, PS2, PS3, respectively, via the contact holes of the interlayer insulating film 14 and the gate insulating film 12.

Embodiment 2

Figure 16:
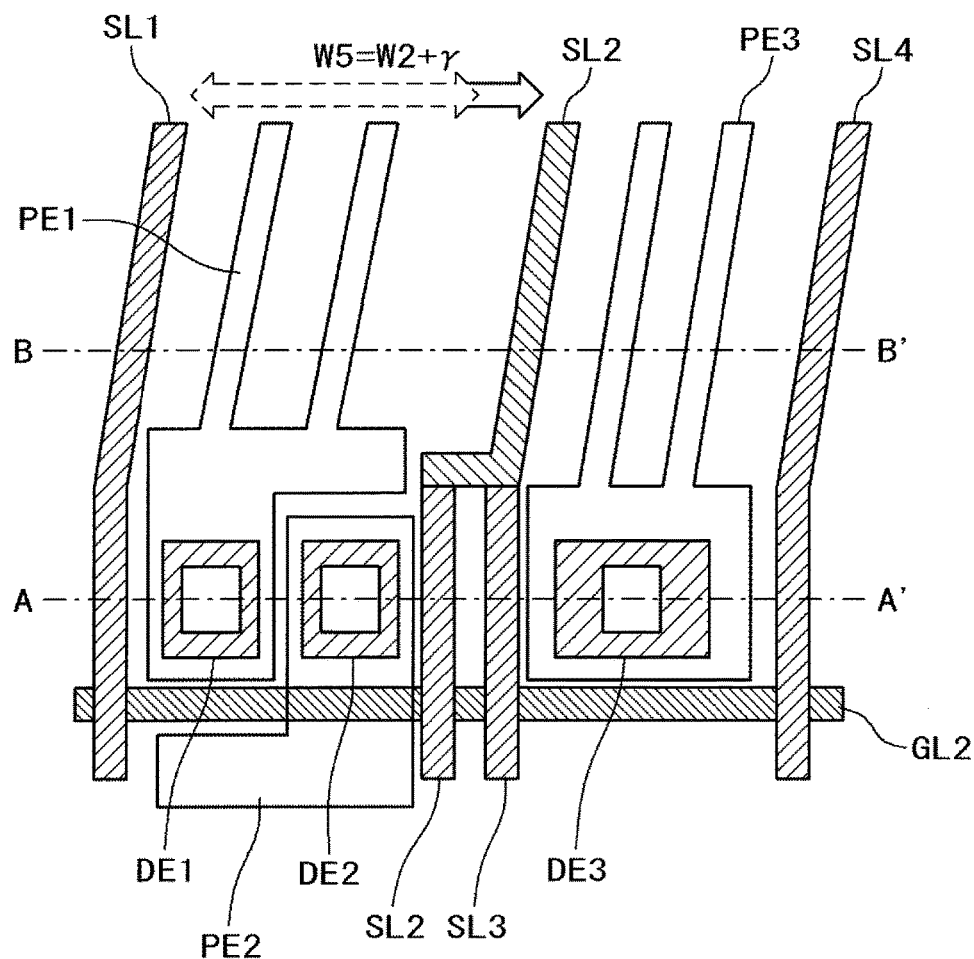
FIG. 16 is a plan view for explaining the display device according to Embodiment 2.
Figure 17:
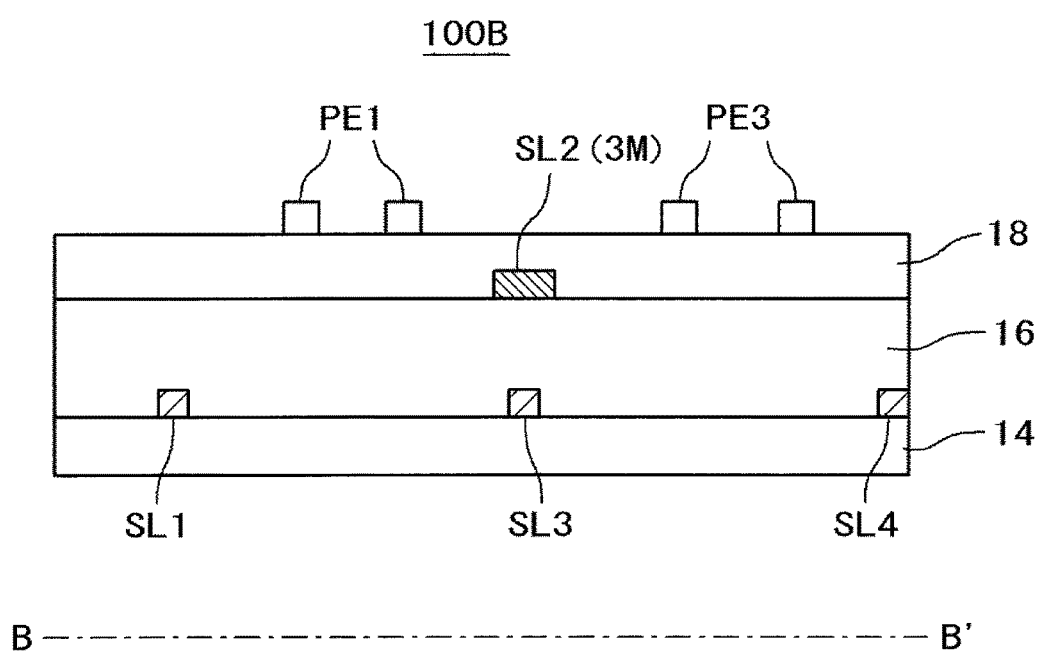
FIG. 17 is a sectional view for explaining the display device according to Embodiment 2.

A display device according to a second embodiment (Embodiment 2) will be described with reference to FIGS. 16 and 17. FIG. 16 is a plan view showing a constitution of the display device according to this embodiment. FIG. 17 is a sectional view taken along the line B-B' of FIG. 16. In addition, a sectional view taken along the line A-A' of FIG. 16 is similar to that of the display device 100A shown in FIG. 8.

A display device 100B according to Embodiment 2 is similar in constitution to the display device 100A according to Embodiment 1 except the arrangement of its signal lines. Whereas part of the signal line SL2 is formed by the same layer as the scan lines in the display device 100A, the display device 100B is such that part of the signal line SL2 is formed by a third interconnect layer (interconnect layer forming neither a signal line nor a scan line) so as to be stacked in layers. The third interconnect layer is formed by an upper layer than the signal lines as an example.

As shown in FIGS. 16 and 17, the display device 100B includes a scan line GL2, an interlayer insulating film 14 formed on the scan line GL2, and signal lines SL1, SL2, SL3, SL4 as well as drain electrodes DE1, DE2, DE3 formed on the interlayer insulating film 14. Further, the display device 100B includes a planarizing film 16 made of an organic insulating film formed on the signal lines SL1, SL2, SL3, SL4 and the drain electrodes DE1, DE2, DE3, a third interconnect layer 3M (signal line SL2) formed on the planarizing film 16, and an interlayer insulating film 18 formed on contact holes of the planarizing film 16 as well as on the planarizing film 16 and the third interconnect layer 3M. Furthermore, the display device 100B includes pixel electrodes PE1, PE2, PE3 formed on contact holes of the interlayer insulating film 18 and on the interlayer insulating film 18. In addition, an unshown common electrode is formed between the planarizing film 16 and the interlayer insulating film 18. The pixel electrodes PE1, PE2, PE3 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, and the pixel electrode PE3 is used for B. The pixel electrodes PE1, PE2, PE3 each have two comb-tooth-like main electrodes, the two main electrodes extending with a rightward inclination of a specified angle relative to the Y direction. The main electrodes of the pixel electrode PE2, although not shown, extend with a leftward inclination of a specified angle relative to the −Y direction.

The signal line SL2 (3M) disposed between R and B is positioned at an upper layer than the signal line SL3. Therefore, an X-direction length (W5) of the opening of R in Embodiment 2 can be made longer than the X-direction length (W2) of the opening of R in Comparative Example 2, so that the opening area can be increased. Thus, the aperture ratio of R can be increased. The signal line SL2 (GL) disposed between G and W is also positioned at the upper layer than the signal line SL3. Therefore, the X-direction length of the opening of G can be increased, so that the opening area can be increased. Thus, the aperture ratio of G can be increased. Since a ratio of the area of signal lines relative to the pixel area can be decreased by virtue of the stacking arrangement of the signal lines, it is implementable to achieve a higher numerical aperture even with high-definition pixels.

Example 2

Figure 18:
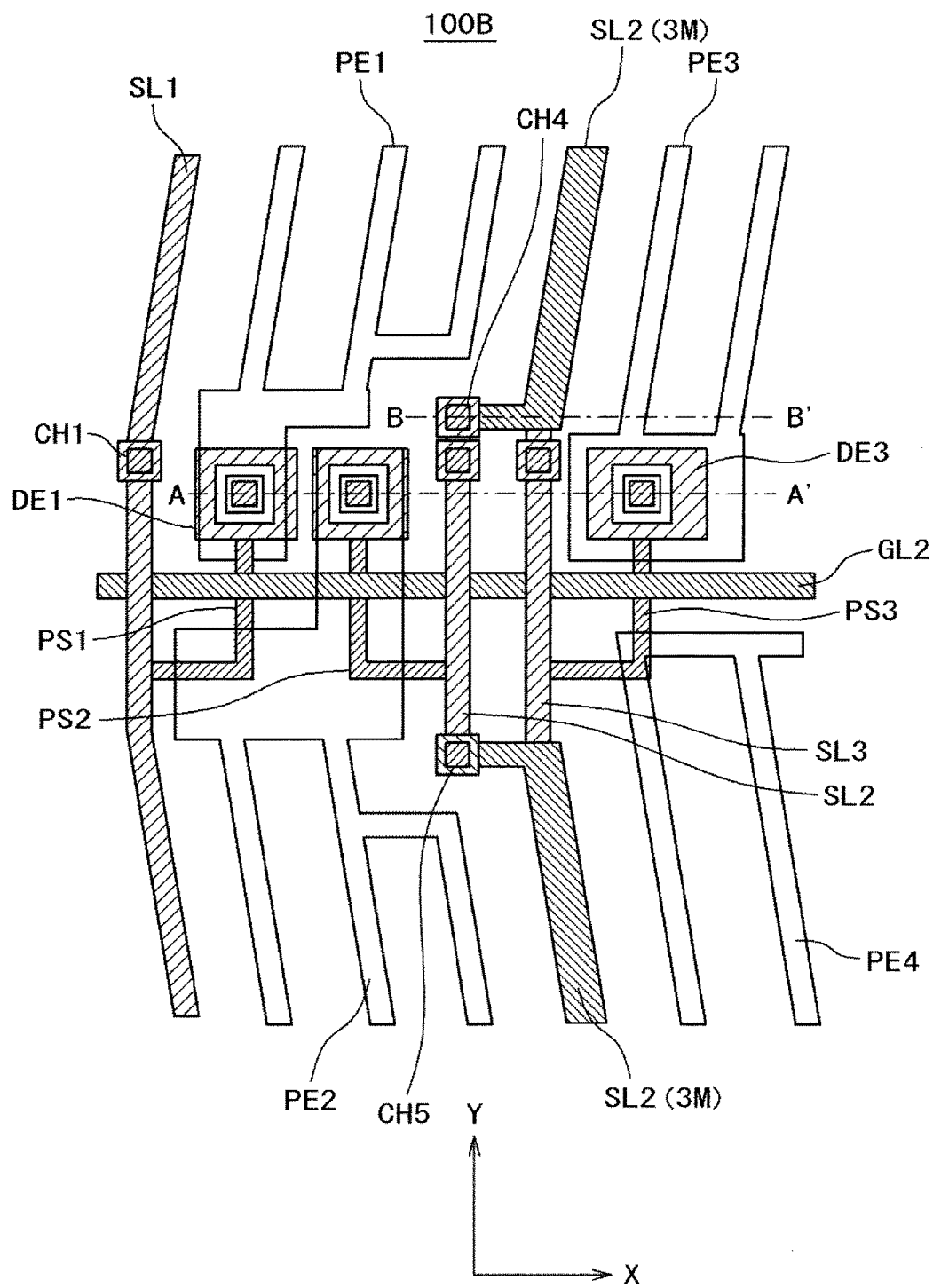
FIG. 18 is a plan view for explaining a display device according to Example 2.
Figure 19:
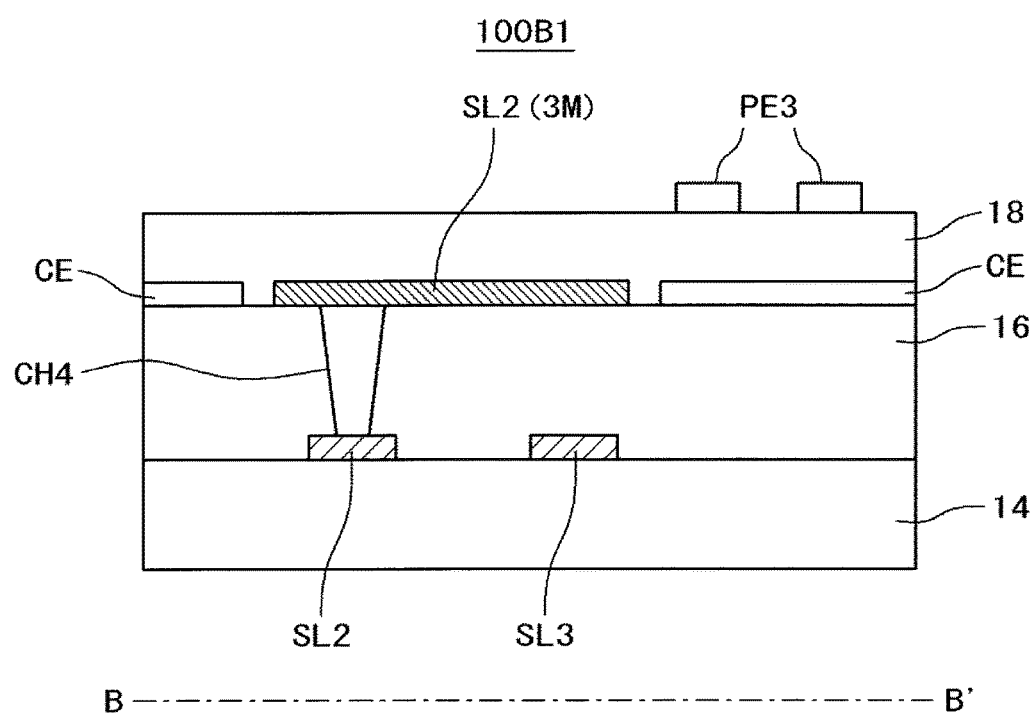
FIG. 19 is a sectional view for explaining the display device according to Example 2.

A display device according to Example 2 will be described with reference to FIGS. 18 and 19. FIG. 18 is a plan view for explaining an arrangement of pixels, scan lines and signal lines in the display device according to Example 2. FIG. 19 is a sectional view taken along the line B-B' of FIG. 18. In addition, a sectional view taken along the line A-A' of FIG. 18 is similar to that of the display device 100A1 shown in FIG. 15.

As shown in FIGS. 18 and 19, the display device 100B1 includes a gate insulating film 12 formed on polysilicon layers PS1, PS2, PS3, a scan line GL2 formed on the gate insulating film 12, an interlayer insulating film 14 formed on the scan line GL2, and signal lines SL1, SL2, SL3 as well as drain electrodes DE1, DE2, DE3 formed on the interlayer insulating film 14. Further, the display device 100B1 includes a planarizing film 16 made of an organic insulating film formed on the signal lines SL1, SL2, SL3 and the drain electrodes DE1, DE2, DE3, a third interconnect layer 3M and a common electrode CE formed on the planarizing film 16, an interlayer insulating film 18 formed on the third interconnect layer 3M as well as on the common electrode CE, and pixel electrodes PE1, PE2, PE3, PE4 formed on the interlayer insulating film 18. The pixel electrodes PE1, PE2, PE3, PE4 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, the pixel electrode PE3 is used for B, and the pixel electrode PE4 is used for W. The pixel electrodes PE1, PE2, PE3, PE4 each have two comb-tooth-like main electrodes. The two main electrodes of the pixel electrodes PE1, PE3 extend with a rightward inclination of a specified angle relative to the Y direction, and the main electrodes of the pixel electrodes PE2, PE4 extend with a leftward inclination of a specified angle relative to the −Y direction.

The signal line SL2 (3M) disposed between R and B is positioned at an upper layer than the signal line SL3. The signal line SL2 extending in the Y direction between R and B is connected to the signal line SL2 (3M) via a contact hole CH4 of the planarizing film 16. The signal line SL2 (3M) disposed between G and W is positioned at the upper layer than the signal line SL3. The signal line SL2 extending in the Y direction between R and G is connected to the signal line SL2 (3M) via a contact hole CH5 of the planarizing film 16. The signal lines SL1, SL2, SL3 and the drain electrodes DE1, DE2, DE3 are connected to the polysilicon layers PS1, PS2, PS3, respectively, via contact holes of the interlayer insulating film 14 and the gate insulating film 12.

Embodiment 3

Figure 20:
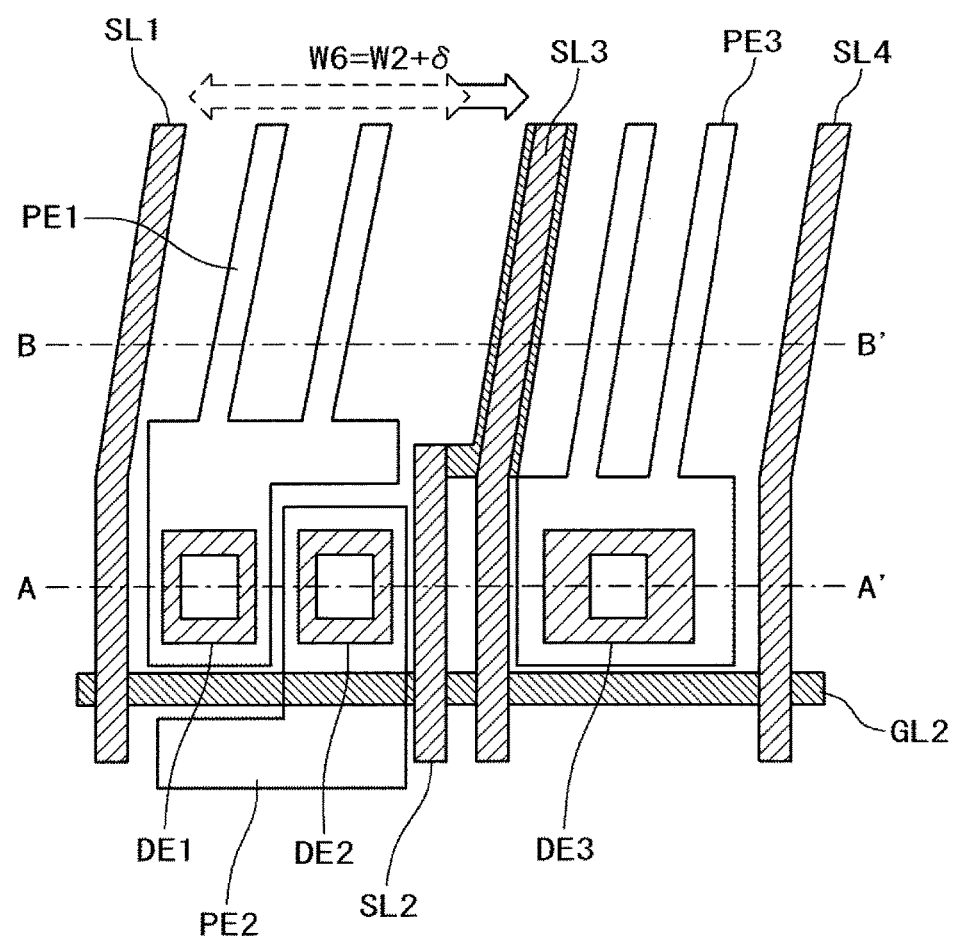
FIG. 20 is a plan view for explaining a display device according to Embodiment 3.
Figure 21:
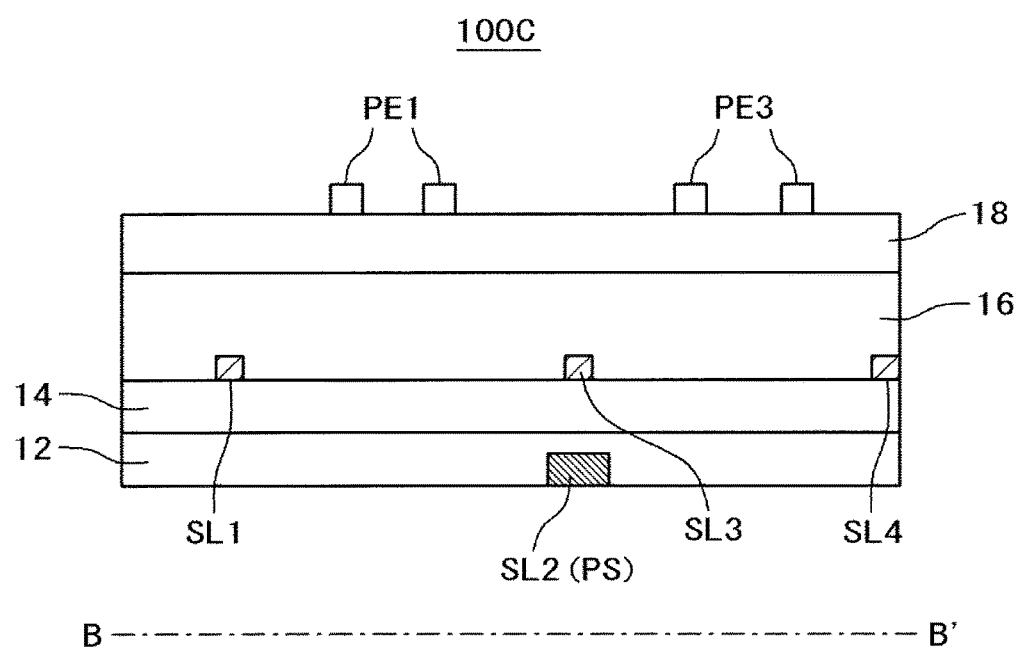
FIG. 21 is a sectional view for explaining the display device according to Embodiment 3.

A display device according to a third embodiment (Embodiment 3) will be described with reference to FIGS. 20 and 21. FIG. 20 is a plan view showing a constitution of the display device according to Embodiment 3. FIG. 21 is a sectional view taken along the line B-B' of FIG. 20. In addition, a sectional view taken along the line A-A' of FIG. 20 is similar to that of the display device 100A shown in FIG. 8.

A display device 100C according to Embodiment 3 is similar in constitution to the display device 100A according to Embodiment 1 except the arrangement of its signal lines. Whereas part of the signal line SL2 is formed by the same layer as the scan lines in the display device 100A, the display device 100C is such that part of the signal line SL2 is formed by a semiconductor layer (polysilicon layer) so as to be stacked in layers. The semiconductor layer is formed by a lower layer of the signal lines.

As shown in FIGS. 20 and 21, the display device 100C includes a signal line SL2 (PS) formed by a polysilicon layer, a gate insulating film 12 formed on the signal line SL2 (PS), a scan line GL2 formed on the gate insulating film 12, a scan line GL2, an interlayer insulating film 14 formed on the scan line GL2, and signal lines SL1, SL2, SL3, SL4 as well as drain electrodes DE1, DE2, DE3 formed on the interlayer insulating film 14. Further, the display device 100C includes a planarizing film 16 made of an organic insulating film formed on the signal lines SL1, SL2, SL3, SL4 and the drain electrodes DE1, DE2, DE3, and an interlayer insulating film 18 formed on contact holes of the planarizing film 16 as well as on the planarizing film 16. Furthermore, the display device 100C includes pixel electrodes PE1, PE2, PE3 formed on contact holes of the interlayer insulating film 18 and on the interlayer insulating film 18. In addition, an unshown common electrode is formed between the planarizing film 16 and the interlayer insulating film 18. The pixel electrodes PE1, PE2, PE3 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, and the pixel electrode PE3 is used for B. The pixel electrodes PE1, PE2, PE3 each have two comb-tooth-like main electrodes, the two main electrodes extending with a rightward inclination of a specified angle relative to the Y direction. The main electrodes of the pixel electrode PE2, although not shown, extend with a leftward inclination of a specified angle relative to the −Y direction.

The signal line SL2 (PS) disposed between R and B is formed by the same layer as the semiconductor layer of TFTs so as to be positioned at a lower layer of the signal line SL3. Therefore, an X-direction length (W6) of the opening of R in Embodiment 3 can be made longer than the X-direction length (W2) of the opening of R in Comparative Example 2, so that the opening area can be increased. Thus, the aperture ratio of R can be increased. The signal line SL2 (GL) disposed between G and W is also formed by the same layer as the scan lines so as to be positioned at the lower layer of the signal line SL3. Therefore, the X-direction length of the opening of G can be increased, so that the opening area can be increased. Thus, the aperture ratio of G can be increased. Since a ratio of the area of signal lines relative to the pixel area can be decreased by virtue of the stacking arrangement of the signal lines, it is implementable to achieve a higher numerical aperture even with high-definition pixels.

Example 3

Figure 22:
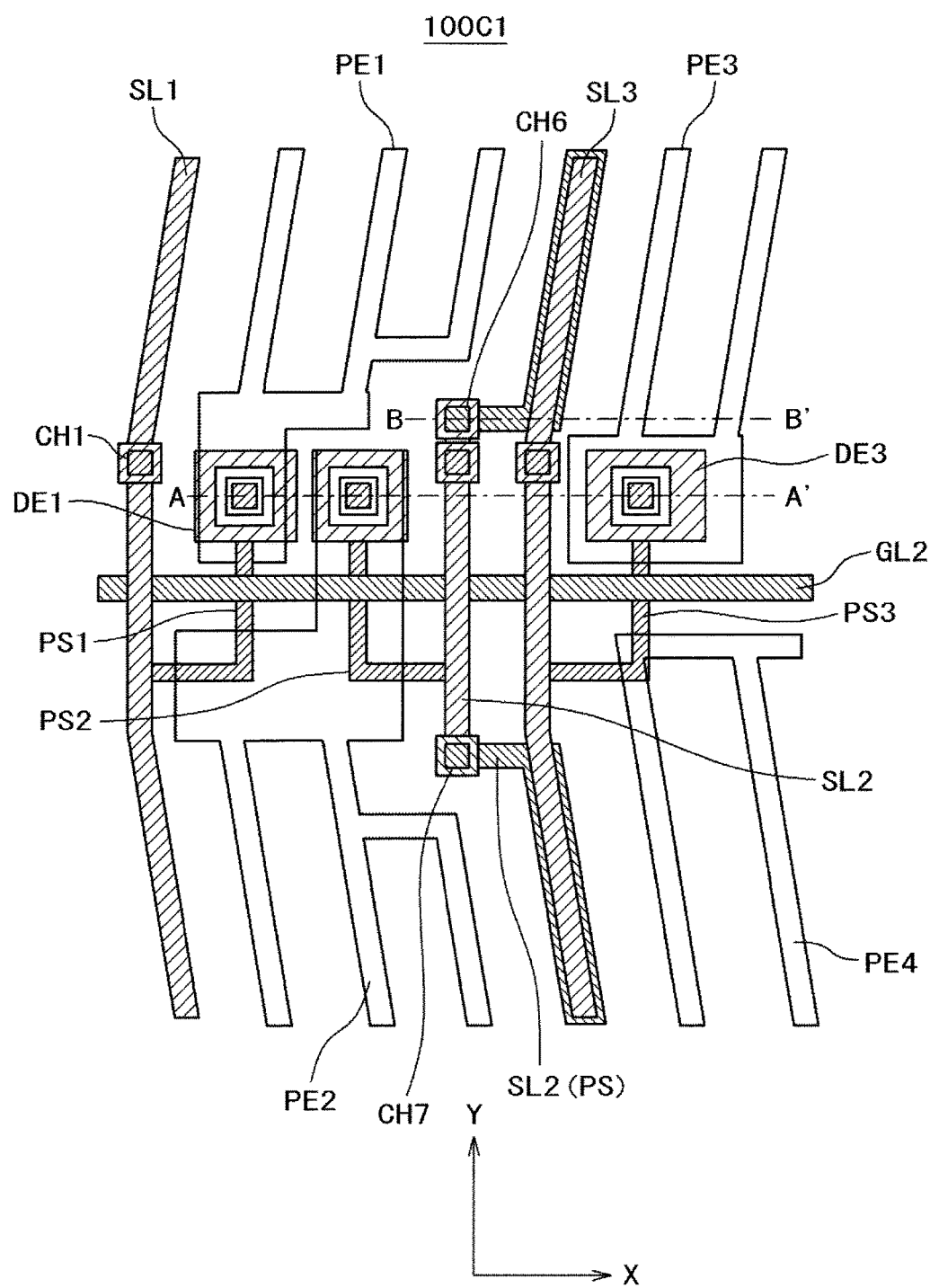
FIG. 22 is a plan view for explaining a display device according to Example 3.
Figure 23:
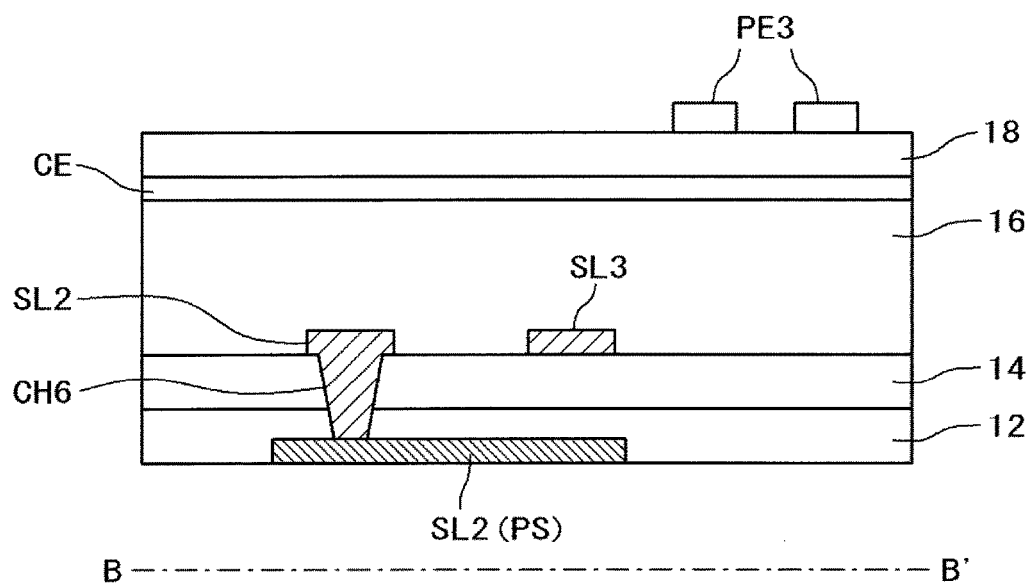
FIG. 23 is a sectional view for explaining the display device according to Example 3.

A display device according to Example 3 will be described with reference to FIGS. 22 and 23. FIG. 22 is a plan view for explaining an arrangement of pixels, scan lines and signal lines in the display device according to Example 3. FIG. 23 is a sectional view taken along the line B-B' of FIG. 22. In addition, a sectional view taken along the line A-A' of FIG. 22 is similar to that of the display device 100A1 shown in FIG. 15.

As shown in FIGS. 22 and 23, the display device 100C1 includes polysilicon layers PS1, PS2, PS3 as well as a signal line SL2 (PS) formed by a polysilicon layer, a gate insulating film 12 formed on the polysilicon layers PS1, PS2, PS3 and the signal line SL2 (PS), a scan line GL2 formed on the gate insulating film 12, a scan line GL2, an interlayer insulating film 14 formed on the scan line GL2, and signal lines SL1, SL2, SL3 as well as drain electrodes DE1, DE2, DE3 formed on the interlayer insulating film 14. Further, the display device 100C1 includes a planarizing film 16 made of an organic insulating film formed on the signal lines SL1, SL2, SL3 and the drain electrodes DE1, DE2, DE3, a common electrode CE formed on the planarizing film 16, an interlayer insulating film 18 formed on the common electrode CE, and pixel electrodes PE1, PE2, PE3, PE4 formed on the interlayer insulating film 18. The pixel electrodes PE1, PE2, PE3, PE4 are connected to the drain electrodes DE1, DE2, DE3, respectively, via contact holes of the interlayer insulating film 18 provided in the contact holes of the planarizing film 16. The pixel electrode PE1 is used for R, the pixel electrode PE2 is used for G, the pixel electrode PE3 is used for B, and the pixel electrode PE4 is used for W. The pixel electrodes PE1, PE2, PE3, PE4 each have two comb-tooth-like main electrodes. The two main electrodes of the pixel electrodes PE1, PE3 extend with a rightward inclination of a specified angle relative to the Y direction, and the main electrodes of the pixel electrodes PE2, PE4 extend with a leftward inclination of a specified angle relative to the −Y direction.

The signal line SL2 (PS) disposed between R and B is formed by the same layer as the polysilicon layers PS1, PS2, PS3 so as to be positioned at a lower layer of the signal line SL3. The signal line SL2 extending in the Y direction between R and G is connected to the signal line SL2 (PS) via a contact hole CH6 of the interlayer insulating film 14. The signal line SL2 (PS) disposed between G and W is also formed by the same layer as the polysilicon layers PS1, PS2, PS3 so as to be positioned at the lower layer of the signal line SL3. The signal line SL2 extending in the Y direction between R and G is connected to the signal line SL2 (PS) via a contact hole CH7 of the interlayer insulating film 14. The signal lines SL1, SL2, SL3 as well as the drain electrodes DE1, DE2, DE3 are connected to the polysilicon layers PS1, PS2, PS3, respectively, via the contact holes of the interlayer insulating film 14 and the gate insulating film 12.

What is claimed is:
1. A display device comprising:
a scan line extending in a first direction;
first, second and third signal lines extending in a second direction;
a first sub-pixel connected to the scan line and the first signal line;
a second sub-pixel connected to the scan line and the second signal line; and
a third sub-pixel connected to the scan line and the third signal line, wherein
the second signal line disposed between the first sub-pixel and the third sub-pixel is formed by a different layer so as to overlap with the third signal line as viewed in a plan view, and
the second signal line disposed between the first sub-pixel and the third sub-pixel is formed by a layer identical to that of the scan line.
2. The display device according to claim 1, wherein
the first and second sub-pixels are disposed so as to be adjacent to each other in the second direction, and
the first sub-pixel is disposed so as to be adjacent to the third sub-pixel in the first direction.
3. The display device according to claim 1, wherein
in vicinity of an intersection of the second signal line with the scan line, the second signal line is formed by a layer identical to that of the third signal line.
4. The display device according to claim 1, wherein
the second signal line disposed between the first sub-pixel and the third sub-pixel is formed on a lower layer of the third signal line.
5. The display device according to claim 1, wherein
the second and third signal lines disposed between the first sub-pixel and the third sub-pixel each extend with an inclination of a specified angle relative to a direction orthogonal to the first direction.
6. The display device according to claim 5, wherein
in vicinity of an intersection of the second and third signal lines with the scan line, the second and third signal lines each extend in a direction orthogonal to the first direction.
7. A display device comprising:
a scan line extending in a first direction;
first, second and third signal lines;
a first sub-pixel connected to the scan line and the first signal line;
a second sub-pixel connected to the scan line and the second signal line; and
a third sub-pixel connected to the scan line and the third signal line, wherein
the second signal line has a portion extending in a second direction, a portion extending in the first direction, and a portion extending in a third direction,
the first and third signal lines each have a portion extending in the second direction and a portion extending in the third direction, and
the portion of the second signal line extending in the third direction is formed by a different layer so as to overlap with the portion of the third signal line extending in the third direction as viewed in a plan view.
8. The display device according to claim 7, wherein
in vicinity of an intersection of the second signal line with the scan line, the second signal line extends in the second direction.
9. The display device according to claim 8, wherein
the third direction is identical to the second direction.
10. The display device according to claim 8, wherein
the third direction is inclined by a specified angle relative to the second direction.

11. The display device according to claim 7, wherein
the portion of the second signal line extending in the first
direction is formed by a layer identical to that of the
portion of the second signal line extending in the third
direction.

12. The display device according to claim 7, wherein
the portion of the second signal line extending in the third
direction is formed by a lower layer than the portion of
the third signal line extending in the third direction.

13. The display device according to claim 12, wherein
the portion of the second signal line extending in the third
direction is formed by a layer identical to that of the
scan line.

14. The display device according to claim 12, wherein
the portion of the second signal line extending in the third
direction is formed by a semiconductor layer.

15. The display device according to claim 7, wherein
the portion of the second signal line extending in the third
direction is formed by an upper layer than the portion
of the third signal line extending in the third direction.

16. The display device according to claim 7, wherein
the portion of the second signal line extending in the third
direction is formed by a third interconnect layer different from those of the scan line and the third signal
line.

* * * * *